United States Patent
Misra

(10) Patent No.: US 8,301,106 B2
(45) Date of Patent: Oct. 30, 2012

(54) STACKED CMOS POWER AMPLIFIER AND RF COUPLER DEVICES AND RELATED METHODS

(75) Inventor: Abhay Misra, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 477 days.

(21) Appl. No.: 12/658,294

(22) Filed: Feb. 10, 2010

(65) Prior Publication Data

US 2011/0195677 A1   Aug. 11, 2011

(51) Int. Cl.
*H04B 1/28* (2006.01)
*H04B 1/16* (2006.01)

(52) U.S. Cl. ........ 455/333; 455/77; 455/127.1; 455/344

(58) Field of Classification Search .............. 455/83, 455/127.1, 73, 106, 78, 333, 550.1, 82, 88, 455/334, 152.2, 343.1, 344, 77; 330/310, 330/285, 305
See application file for complete search history.

(56) References Cited

U.S. PATENT DOCUMENTS

| | | | | |
|---|---|---|---|---|
| 5,903,820 | A | 5/1999 | Hagström ........................ 455/82 |
| 6,531,860 | B1 | 3/2003 | Zhou et al. .................... 324/105 |
| 6,759,922 | B2 | 7/2004 | Adar et al. .................... 333/109 |
| 6,798,287 | B2 | 9/2004 | Wu et al. ........................ 330/129 |
| 7,493,094 | B2 | 2/2009 | Ichitsubo et al. ........... 455/127.1 |
| 7,741,710 | B2 | 6/2010 | Ichitsubo et al. ............. 257/724 |
| 7,741,904 | B2 * | 6/2010 | Ichitsubo et al. ............. 330/133 |
| 7,747,227 | B2 | 6/2010 | Fukuda ............................ 455/91 |
| 7,769,355 | B2 * | 8/2010 | Ichitsubo et al. ........... 455/127.1 |
| 2008/0299913 | A1 * | 12/2008 | Han et al. ......................... 455/83 |
| 2009/0273397 | A1 | 11/2009 | Bockelman et al. ............ 330/51 |
| 2009/0278609 | A1 | 11/2009 | Srinivasan et al. ............ 330/297 |
| 2011/0001576 | A1 | 1/2011 | Lee et al. ...................... 333/116 |

* cited by examiner

*Primary Examiner* — John J Lee
(74) *Attorney, Agent, or Firm* — O'Keefe, Egan, Peterman & Enders LLP

(57) ABSTRACT

Stacked CMOS power amplifier (PA) and radio frequency (RF) coupler devices and related methods are disclosed. The stacked device includes a CMOS PA die configured to receive a transmit input signal and to output an amplified transmit signal, and a RF coupler device configured to receive the amplified transmit signal, to output an antenna transmit signal, and to output an RF signal proportional to the antenna transmit signal. The CMOS PA die and the RF coupler device are stacked on top of and electrically coupled to each other, and the CMOS PA die and the RF coupler device are combined within a single semiconductor package. In some embodiments, the RF coupler device is positioned on top of the CMOS PA die, and in other embodiments the CMOS PA die is positioned on top of the RF coupler device.

11 Claims, 4 Drawing Sheets

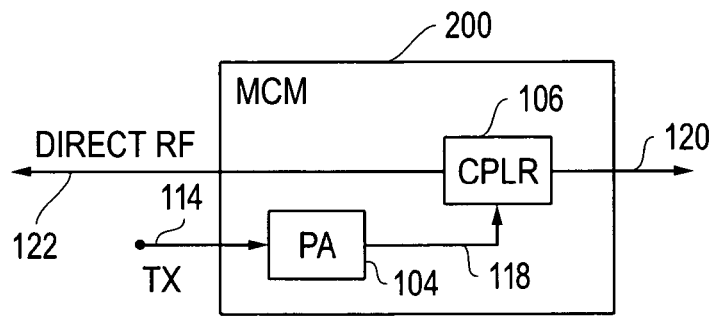
*FIG. 2*
*(Prior Art)*
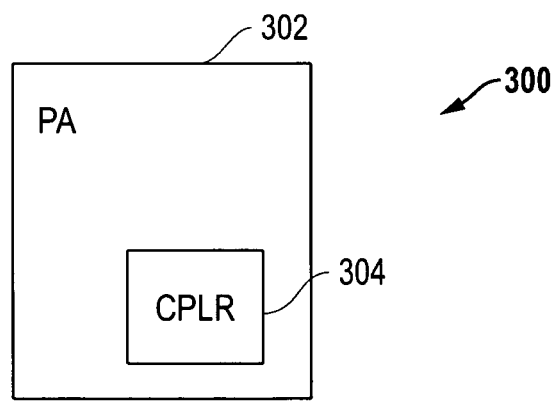
*FIG. 3*
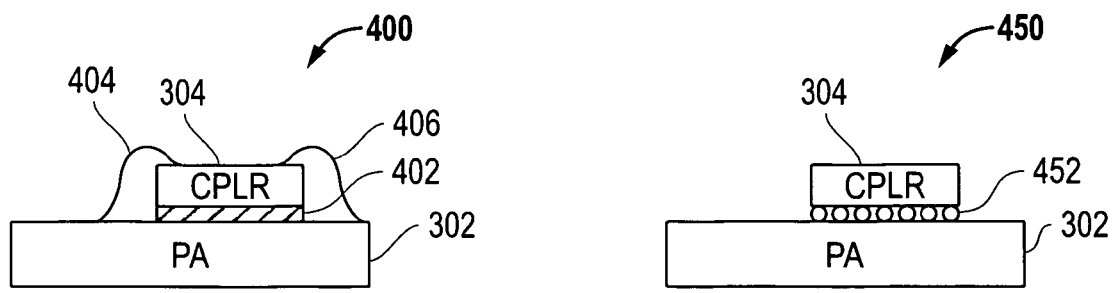
*FIG. 4A*  *FIG. 4B*

_US 8,301,106 B2_

STACKED CMOS POWER AMPLIFIER AND RF COUPLER DEVICES AND RELATED METHODS

TECHNICAL FIELD OF THE INVENTION

This invention relates to radio frequency (RF) power amplifiers and, more particularly, to RF power amplifiers and RF couplers for signal transmission in wireless devices.

BACKGROUND

In wireless communication devices, radio frequency (RF) power amplifiers (PAs) are often used to provide transmit signals at increased power levels needed for operation within a communication system. For example, cellular telephone devices use PAs to transmit signals at power levels needed to communicate effectively with cellular base stations. In addition, these transmit power levels must often be regulated by the communication device. In prior communication devices, an RF coupler has been used to split off a proportional part of the transmit output signal so that the transmit output power can be monitored by the system.

FIG. 1 (Prior Art) is a block diagram for an embodiment 100 including an RF coupler 106 and power amplifier (PA) integrated circuit 104 for transmission of signals in a wireless communication system. As depicted, a transceiver or baseband integrated circuit (IC) 102 sends a transmit (TX) signal 114 to the PA integrated circuit 104. The integrated circuit 102 is also configured to provide a transmit power (TX PWR) control signal 123 to the CMOS PA 104. The CMOS PA 104 in turn provides an amplified signal 118 to a radio frequency (RF) coupler 106. The RF coupler 106 operates to send the transmit signals 120 on to a duplexer 108, which in turn sends and receives signals to and from the switch (SW) 110 and the antenna 112. In addition to sending transmit signals 120 to the switch (SW) 110, the duplexer 108 also communicates receive (RX) signals 116 back to the transceiver/baseband IC 102. In addition to passing along the transmit signals 120 to the duplexer 108, the RF coupler 106 also sends back to the transceiver IC 102 a direct RF signal (DIRECT RF) 122 having power proportional to the transmit output power. The transceiver IC 102 utilizes this RF signal (DIRECT RF) 122 as a feedback RF signal to monitor and determine transmit output power settings and other operational details related to the transmit operations of the communication device. Thus, the transmit power (TX PWR) control signal 123 from the integrated circuit 102 is at least in part dependent upon this feedback RF signal (DIRECT RF) 122 from the RF coupler 106.

In many communication devices, such as cellular telephone devices, it is desirable to reduce the size required on a printed circuit board (PCB) to mount all of the components and integrated circuits (ICs) needed to implement the communication device. To achieve a reduced form factor, some solutions have combined a PA packaged IC device and an RF coupler (CPLR) packaged IC device into a multi-chip module (MCM).

FIG. 2 (Prior Art) is a diagram for a MCM 200 that includes a PA 104 as a first packaged IC device and a coupler (CPLR) 106 as a second packaged IC device. As stated above, the transmit (TX) signal 114 is received by the PA 104, and an amplified signal 118 is then provided to the coupler (CPLR) 106. The coupler (CPLR) 106 transmits the output signal 120 and sends back the RF signal (DIRECT RF) 122 that is used by the transceiver IC 102 to monitor transmit operations. For the MCM 200, the PA 104 and the coupler (CPLR) 106 are separate monolithic IC device packages that are mounted onto each other to make a combination device. In this way, the MCM 200 requires a smaller area on a PCB than would be required for separately mounting a PA and an RF coupler on the PCB.

For many communication devices, however, further reduction in the surface area and space required for the PA/coupler utilized by these communication devices is desirable.

SUMMARY OF THE INVENTION

Stacked CMOS power amplifier and radio frequency (RF) coupler devices and related methods are disclosed. The stacked CMOS power amplifier and radio frequency (RF) coupler device includes a CMOS power amplifier (PA) die configured to receive a transmit input signal and to output an amplified transmit signal, and a radio frequency (RF) coupler device configured to receive the amplified transmit signal, to output an antenna transmit signal, and to output an RF signal proportional to the antenna transmit signal. In addition, the CMOS PA die and the RF coupler device are stacked on top of and electrically coupled to each other, and the CMOS PA die and the RF coupler device are combined within a single semiconductor package. In some embodiments, the RF coupler device is positioned on top of the CMOS PA die, and in other embodiments the CMOS PA die is positioned on top of the RF coupler device. This single semiconductor package provides an advantageously small form factor for communication devices that utilize the stacked CMOS power amplifier and radio frequency (RF) coupler device. Other features and variations can be implemented, if desired, and related systems and methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIG. 2 is a block diagram for a prior multi-chip module solution.

FIG. 3 is a block diagram for an embodiment of a stacked solution having a radio frequency coupler device positioned on top of the CMOS power amplifier die.

FIG. 4A is a diagram for the stacked solution of FIG. 3 using wire-bonding.

FIG. 4B is a diagram for the stacked solution of FIG. 3 using flip-chip processing.

DETAILED DESCRIPTION OF THE INVENTION

Stacked CMOS power amplifier and radio frequency (RF) coupler devices and related methods are disclosed. The stacked CMOS power amplifier and radio frequency (RF)

coupler device includes a CMOS power amplifier (PA) die configured to receive a transmit input signal and to output an amplified transmit signal, and a radio frequency (RF) coupler device configured to receive the amplified transmit signal, to output an antenna transmit signal, and to output an RF signal proportional to the antenna transmit signal. In addition, the CMOS PA die and the RF coupler device are stacked on top of and electrically coupled to each other, and the CMOS PA die and the RF coupler device are combined within a single semiconductor package.

Figure 1:
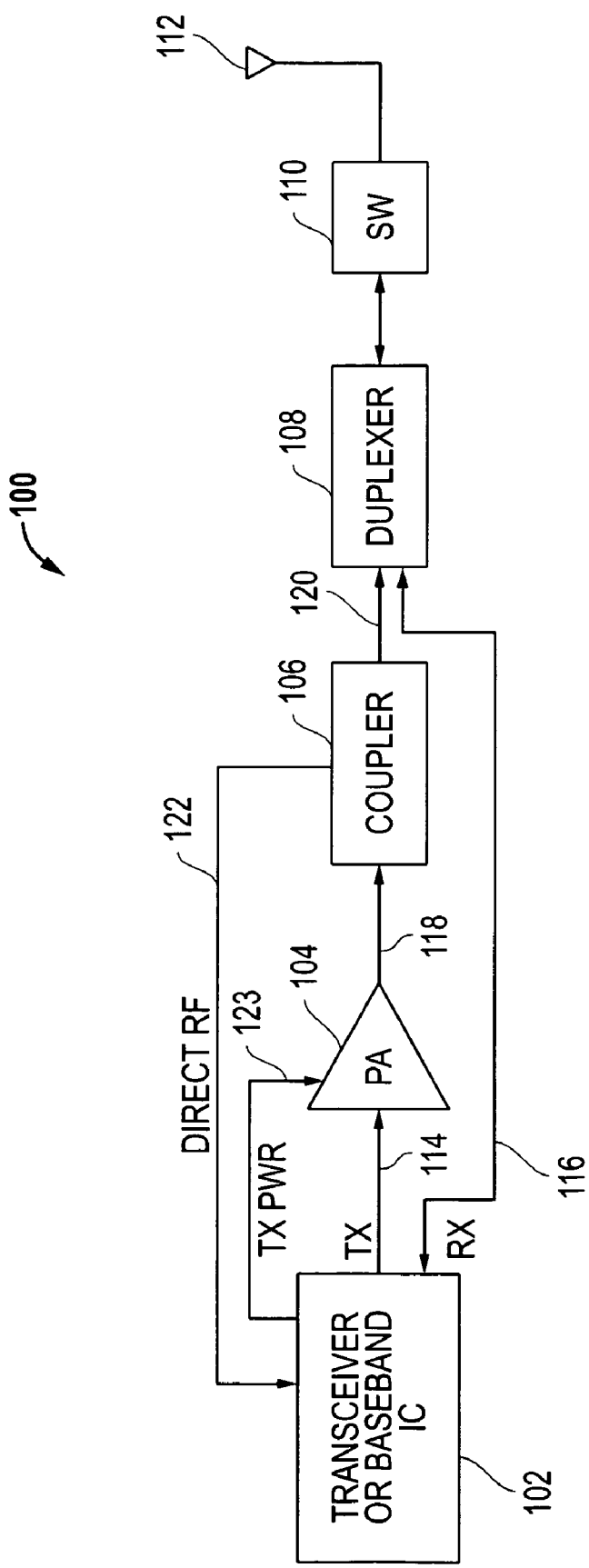
FIG. 1 is a block diagram of circuitry for a communication device that includes a power amplifier and a radio frequency coupler.
Figure 5:
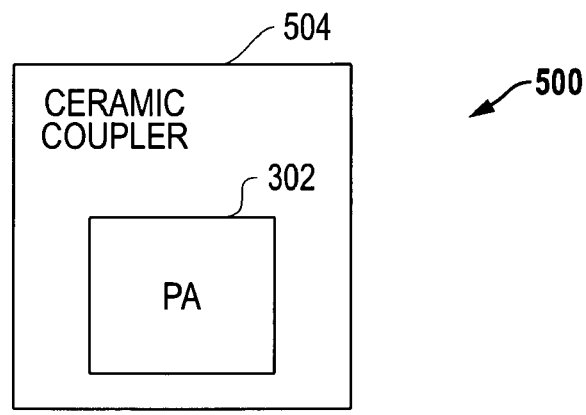
FIG. 5 is a block diagram for an embodiment of a stacked solution having CMOS power amplifier die positioned on top of the radio frequency coupler device.
Figure 6A:
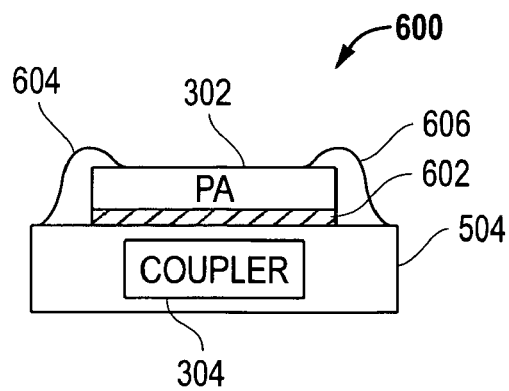
FIG. 6A is a diagram for the stacked solution of FIG. 5 using wire-bonding.
Figure 6B:
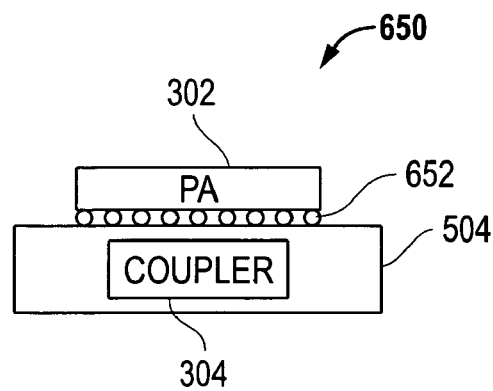
FIG. 6B is a diagram for the stacked solution of FIG. 5 using flip-chip processing.

FIGS. 3, 4A and 4B are directed to embodiments where the CMOS PA die is positioned on top of the RF coupler device. FIGS. 5, 6A and 6B are directed to embodiments where the RF coupler device is positioned on top of the CMOS PA die. The resulting single semiconductor package provides an advantageously small form factor for communication devices that utilize the stacked CMOS power amplifier and radio frequency (RF) coupler device.

It is noted that CMOS PAs that may utilized in the embodiments described herein include CMOS PAs described in the following co-pending applications: U.S. patent application Ser. No. 12/151,199, entitled "Controlling Power with an Output Network" and filed May 5, 2008 (now published as U.S. Published Patent Application 2009-0273397), and U.S. patent application Ser. No. 12/151,812, entitled "Supply Control For Multiple Power Modes Of A Power Amplifier" and filed May 8, 2008 (now published as U.S. Published Patent Application 2009-0278609), each of which is hereby incorporated by reference in its entirety.

FIG. 3 is diagram for an embodiment 300 for a stacked solution for a CMOS power amplifier (PA) die 302 and a radio frequency (RF) coupler (CPLR) device 304. The coupler (CPLR) device 304 is relatively small and can be mounted or fabricated directly on top of the CMOS PA die 302 prior to its being packaged. For example, the coupler device 304 can be an RF coupler device manufactured using a CMOS process. This CMOS coupler device can then be directly mounted onto the CMOS PA die 302 and electrically connected using wire-bonding, flip-chip and/or other connection mechanisms as desired. Alternatively, the RF coupler device 304 can be integrated directly onto the CMOS PA die 302 as an integrated passive device (IPD) manufactured using a CMOS process. This CMOS IPD coupler is then already electrically coupled to the CMOS PA 302 after this manufacturing process.

In contrast with prior solutions, the coupler (CPLR) device 304 and the CMOS PA die 302 in FIG. 3 are stacked prior to packaging of these devices into a single semiconductor package. Once the coupler device 304 has been stacked and electrically coupled to the CMOS PA die 302, the combined device can be over-molded, snapped, sawed and/or otherwise processed to provide a complete PA/coupler packaged part having a form factor representing a single monolithic integrated circuit. Further, in contrast with prior solutions where the coupler and PA are made using different processes and are separately packaged devices, because the coupler (CPLR) device 304 and the PA die 302 can both be manufactured using CMOS processing, they will tend to expand and contract due to temperature in a similar manner during operation of the two devices. As such, the coupler (CPLR) device 304 and the CMOS PA die 302 can be directly stacked and connected while still providing good mechanical and electrical connections over time as the combined devices are operated in a communication device.

FIG. 4A is a diagram for an embodiment 400 where the coupler (CPLR) device 304 is a separately manufactured CMOS coupler device that is stacked on and wire bonded to the PA die 302 prior to final packaging. As depicted, connection wires 404 and 406 are representative of the bond wires used to electrically couple the coupler device 304 to the PA die 302. It is noted that a separate bond wire can be provided for each desired connection. Further, as depicted, layer 402 represents an adhesive insulator that can be provided between the coupler (CPLR) device 304 and the PA die 302 as desired.

It is further noted that layer 402 can be implemented as a spacer material configured to decouple the PA die 302 and the coupler device 304. The spacer material can be a highly resistive material, such as Si, glass, quartz or other highly resistive substrate, that helps to prevent losses. This spacer material can be adhered to the surface of the PA die 302 and the backside of the coupler device 304, for example, using standard die stacking assembly technology. The spacer material is thereby inserted between the stacked PA die 302 and the coupler device 304 in essence increasing the distance between the two die.

FIG. 4B is a diagram for an embodiment 450 where the coupler (CPLR) device 304 is a separately manufactured CMOS coupler device that is stacked on the PA die 302 and coupled to the PA die 302 using flip-chip processing. For flip-chip processing, the coupler device 304 is manufactured with connections on its top surface that are then coupled to the PA die 302 using solder bumps 452 as part of the flip-chip processing.

It is further noted that the flip-chip solution is not possible with traditional PA technologies, such as PAs manufactured using GaAs processing, AlGaAs processing, InGaP processing and other Ga related processing technologies because the resulting devices require a backside connection. This requirement for a backside connection essentially precludes the use of flip-chip processing.

FIG. 5 is diagram for an alternative embodiment 500 for a stacked solution for a CMOS power amplifier (PA) die 302 and a coupler device, where the coupler device is embedded into a ceramic package 504. The ceramic package 504 may be, for example, a LTCC (low-temperature co-fired ceramic) or other dielectric material within which the coupler device is embedded. The PA die 302 is then mounted onto the ceramic package 504 and electrically connected using wire-bonding, flip-chip and/or other connection mechanisms as desired.

Again, in contrast with prior solutions, the coupler (CPLR) device 304 within the ceramic package 504 and the CMOS PA die 302 in FIG. 5 are stacked prior to packaging of these devices. Once the CMOS PA die 302 has been stacked and electrically coupled to the coupler (CPLR) device 304, the combined device can be over-molded, snapped, sawed and/or otherwise processed to provide a complete PA/coupler packaged part having a form factor representing a single monolithic semiconductor package. Further, in contrast with prior solutions where the coupler and PA are made using different processes and are separately packaged IC devices, because the coupler (CPLR) device 304 and the PA die 302 can both be manufactured using CMOS processing, they will tend to expand and contract due to temperature in a similar manner during operation of the two devices.

FIG. 6A is a diagram for an embodiment 600 where the PA die 302 is stacked on and wire-bonded to the coupler device 304 within a ceramic package 504. As depicted, connection wires 604 and 606 are representative of the bond wires used to electrically couple the PA die 302 to the coupler device 304 embedded within ceramic package 504. It is noted that a separate bond wire can be provided for each desired connection. Further, as depicted, layer 602 represents an adhesive insulator that can be provided between the ceramic package 504 and the PA die 302 as desired.

As with layer 402 in FIG. 4A, layer 602 can be implemented as a spacer material configured to decouple the PA die 302 and the ceramic package 504. The spacer material can be a highly resistive material, such as Si, glass, quartz or other highly resistive substrate, that helps to prevent losses. This spacer material can be adhered to the surface of the ceramic package 504 and the backside of the PA die 302, for example, using standard die stacking assembly technology. The spacer material is thereby inserted between the stacked PA die 302 and the ceramic package 504 in essence increasing the distance between the two die.

FIG. 6B is a diagram for an embodiment 650 where the PA die 302 is stacked on and coupled to the coupler device 304 embedded within the ceramic package 504 using flip-chip processing. For flip-chip processing, the PA die 302 is manufactured with connections on its top surface that are then coupled to connections on the ceramic package 504 using solder bumps 652 as part of the flip-chip processing.

Advantageously, the stacked PA/coupler embodiments described herein are packaged after stacking. As such, the stacked PA/coupler packaged part has a reduced form factor representing a single monolithic semiconductor package.

Figure 7:
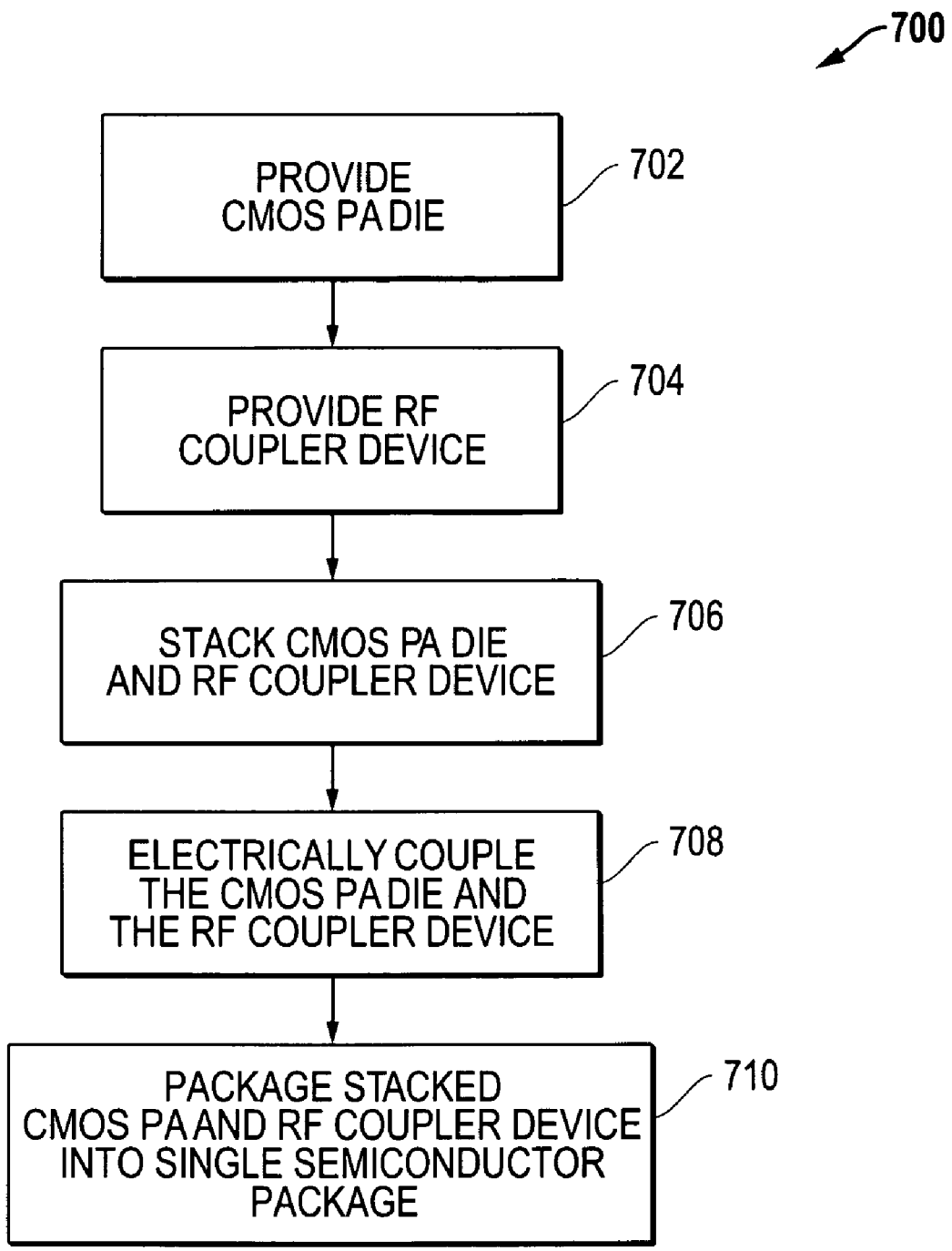
FIG. 7 is a process diagram of an embodiment for forming a single semiconductor package with a CMOS power amplifier die and a radio frequency coupler device.

FIG. 7 is a process diagram of an embodiment 700 for forming a single semiconductor package with a CMOS power amplifier die and a radio frequency coupler device. In block 702, a CMOS PA die is provided that is configured to receive a transmit input signal and to output an amplified transmit signal, as described above. In block 704, an RF coupler device is provided that is configured to receive the amplified transmit signal, to output an antenna transmit signal, and to output an RF signal proportional to the antenna transmit signal, as described above. Next, in block 706, the CMOS PA die and the RF coupler device are stacked on top of each other. In block 708, the CMOS PA die and the RF coupler device are then electrically coupled to each other. Finally, in block 710, the stacked CMOS PA die and RF coupler device are packaged into a single semiconductor package. It is noted that if the RF coupler device is directly integrated onto the CMOS PA die, as described above, then the steps set forth in blocks 704 to 708 would occur as part of that integration process.

It is noted that the packaging of the CMOS PA die and RF coupler device into a single semiconductor package can be implemented in a variety of ways, using standard semiconductor packaging techniques. For example, the stacked device can be encapsulated in an plastic, insulated package with external bond wires, external connection pins and/or external bonding pads as is done for many integrated circuits. However, it is understood that other packaging techniques could be utilized while still taking advantage of the single semiconductor package for a CMOS PA and RF coupler device as described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A communication device, comprising:
    an integrated circuit configured to output a transmit signal and to receive a feedback RF signal;
    a stacked CMOS power amplifier (PA) and radio frequency (RF) coupler device, comprising:
        a CMOS power amplifier (PA) die configured to receive the transmit signal and to output an amplified transmit signal; and
        a radio frequency (RF) coupler device configured to receive the amplified transmit signal, to output an antenna transmit signal, and to output a feedback RF signal proportional to the antenna transmit signal;
        wherein the CMOS PA die and the RF coupler device are stacked on top of and electrically coupled to each other; and
        wherein the CMOS PA die and the RF coupler device are combined within a single semiconductor package;
    wherein the integrated circuit is further configured to utilize the feedback RF signal to provide a transmit power control signal to the CMOS power amplifier die within the stacked CMOS power amplifier (PA) and radio frequency (RF) coupler device.

2. The communication device of claim 1, further comprising an antenna coupled to an antenna switch and a duplexer coupled between the antenna switch and the RF coupler device.

3. The communication device of claim 1, wherein the RF coupler device is positioned on top of the CMOS PA die.

4. The communication device of claim 3, wherein the RF coupler device comprises a CMOS coupler device integrated directly on top of the CMOS PA die.

5. The communication device of claim 3, wherein the RF coupler device comprises a CMOS coupler device mounted on top of the CMOS PA die.

6. The communication device of claim 1, wherein the CMOS PA die is positioned on top of the RF coupler device.

7. The communication device of claim 6, wherein the RF coupler device comprises an RF coupler embedded within a ceramic package.

8. The communication device of claim 6, wherein the CMOS PA die is mounted on top of the ceramic package.

9. A method for communicating radio frequency (RF) signals, comprising:
    operating a stacked CMOS power amplifier (PA) and radio frequency (RF) coupler device, comprising:
        a CMOS power amplifier (PA) die configured to receive the transmit signal and to output an amplified transmit signal; and
        a radio frequency (RF) coupler device configured to receive the amplified transmit signal, to output an antenna transmit signal, and to output a feedback RF signal proportional to the antenna transmit signal;
        wherein the CMOS PA die and the RF coupler device are stacked on top of and electrically coupled to each other; and
        wherein the CMOS PA die and the RF coupler device are combined within a single semiconductor package;
    generating a transmit signal;
    amplifying the transmit signal with the CMOS PA die;
    utilizing the RF coupler device to output the antenna transmit signal to an antenna;
    further utilizing the RF coupler device to provide a feedback RF signal; and
    using the feedback RF signal to control at least in part the amplifying step.

10. The method of claim 9, wherein the RF coupler device is positioned on top of the CMOS PA die.

11. The method of claim 9, wherein the CMOS PA die is positioned on top of the RF coupler device.

* * * * *